(12) United States Patent
Hung

(10) Patent No.: US 7,990,707 B2
(45) Date of Patent: Aug. 2, 2011

(54) ELECTRONIC DEVICE WITH A FAN

(75) Inventor: Tzu-Hsiu Hung, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 86 days.

(21) Appl. No.: 12/612,014

(22) Filed: Nov. 4, 2009

(65) Prior Publication Data

US 2010/0290185 A1 Nov. 18, 2010

(30) Foreign Application Priority Data

May 14, 2009 (CN) ...................... 2009 2 0303140 U

(51) Int. Cl.
*H05K 7/20* (2006.01)
(52) U.S. Cl. ........................................ 361/695; 361/694
(58) Field of Classification Search ............. 361/679.48, 361/679.5, 694, 695; 454/184
See application file for complete search history.

(56) References Cited

U.S. PATENT DOCUMENTS

| | | | |
|---|---|---|---|
| 6,549,406 B1 * | 4/2003 | Olesiewicz et al. | ........... 361/695 |
| 7,227,748 B2 * | 6/2007 | Garnett | ..................... 361/679.31 |
| 7,349,211 B2 * | 3/2008 | Chen et al. | ..................... 361/695 |
| 7,385,813 B2 * | 6/2008 | Lin | ................................. 361/695 |
| 7,411,788 B2 * | 8/2008 | Liang | ............................. 361/695 |
| 7,583,498 B2 * | 9/2009 | Chen et al. | ............... 361/679.48 |
| 7,599,179 B2 * | 10/2009 | Chen et al. | ............... 361/679.48 |
| 7,826,224 B2 * | 11/2010 | Sun | ................................. 361/697 |
| 2009/0141449 A1 * | 6/2009 | Yeh et al. | ...................... 361/695 |

\* cited by examiner

*Primary Examiner* — Gregory D Thompson
(74) *Attorney, Agent, or Firm* — Raymond J. Chew

(57) ABSTRACT

An electronic device includes a fan including a frame, and an enclosure. The frame includes a plurality of mounting holes respectively positioned in a plurality of diagonal corners of the frame. The enclosure includes a plurality of sidewalls and a plurality of fixing members to fix the fan in the enclosure. Each of the plurality of fixing members projects from an inner surface of one of the plurality of sidewalls and is integrally formed with the sidewall. Each of the plurality of fixing members includes a clasping portion, and a cushioning portion between the clasping portion and the sidewall and having an angled shape. The plurality of cushioning portions are corresponding to the plurality of mounting holes and positioned between the fan and the sidewall.

5 Claims, 2 Drawing Sheets

ELECTRONIC DEVICE WITH A FAN

BACKGROUND

1. Technical Field

The present disclosure relates to electronic devices, and more particularly to an electronic device with a fixing member to fix a fan in the electronic device.

2. Description of Related Art

In electronic devices, such as desktop computers, servers, and Internet appliances, for example, fans are required to dissipate heat generated by electronic elements received in the electronic devices, such as central processing units (CPUs) and integrated circuits (ICs), for example. A frequently used fan is directly fixed in an enclosure of the electronic device with screws, resulting in inconvenience of assembly or disassembly of the fan.

Therefore, a need exists in the industry to overcome the described limitations.

DETAILED DESCRIPTION

Figure 1:
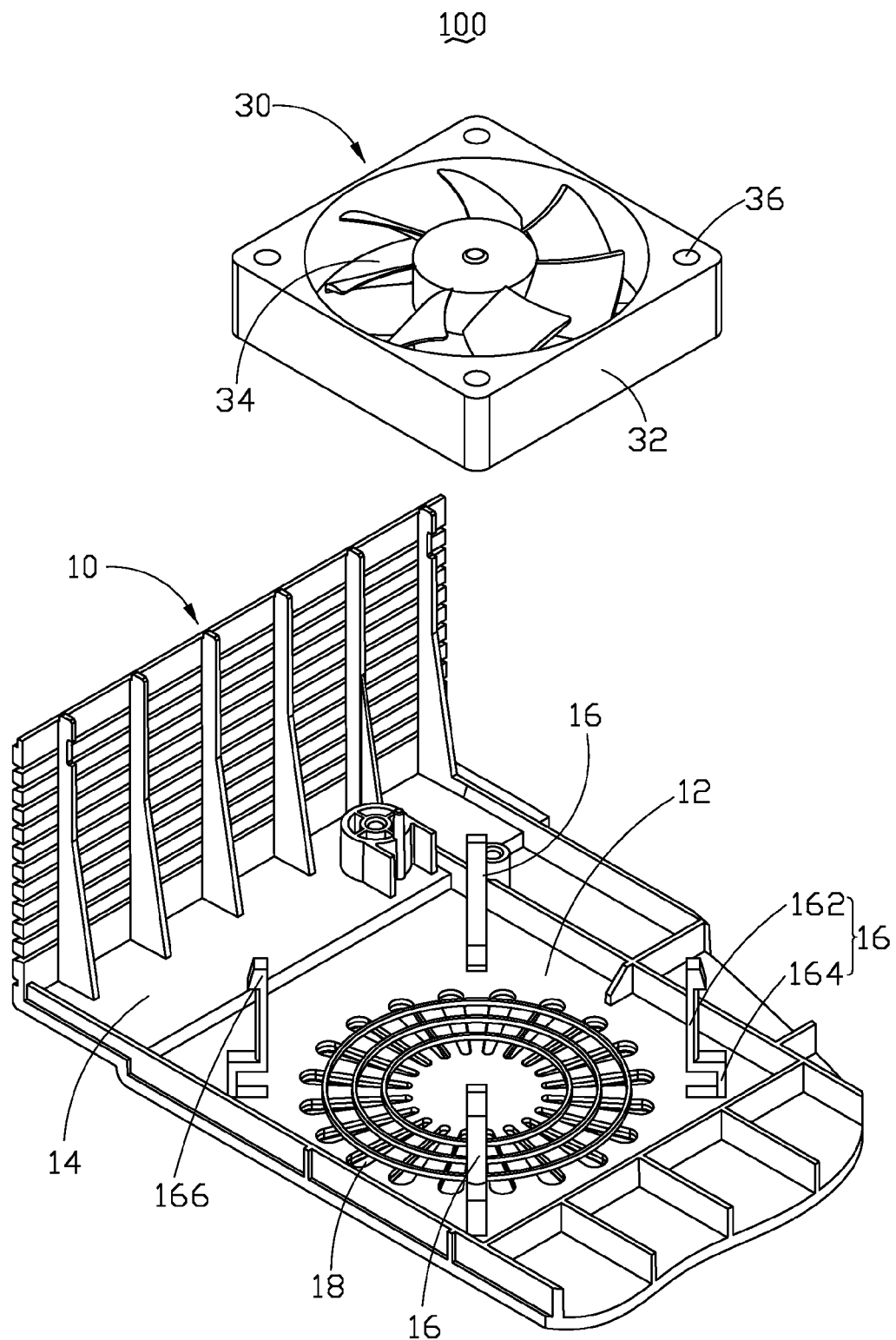
FIG. 1 is an exploded, isometric view of an electronic device of an exemplary embodiment of the disclosure.
Figure 2:
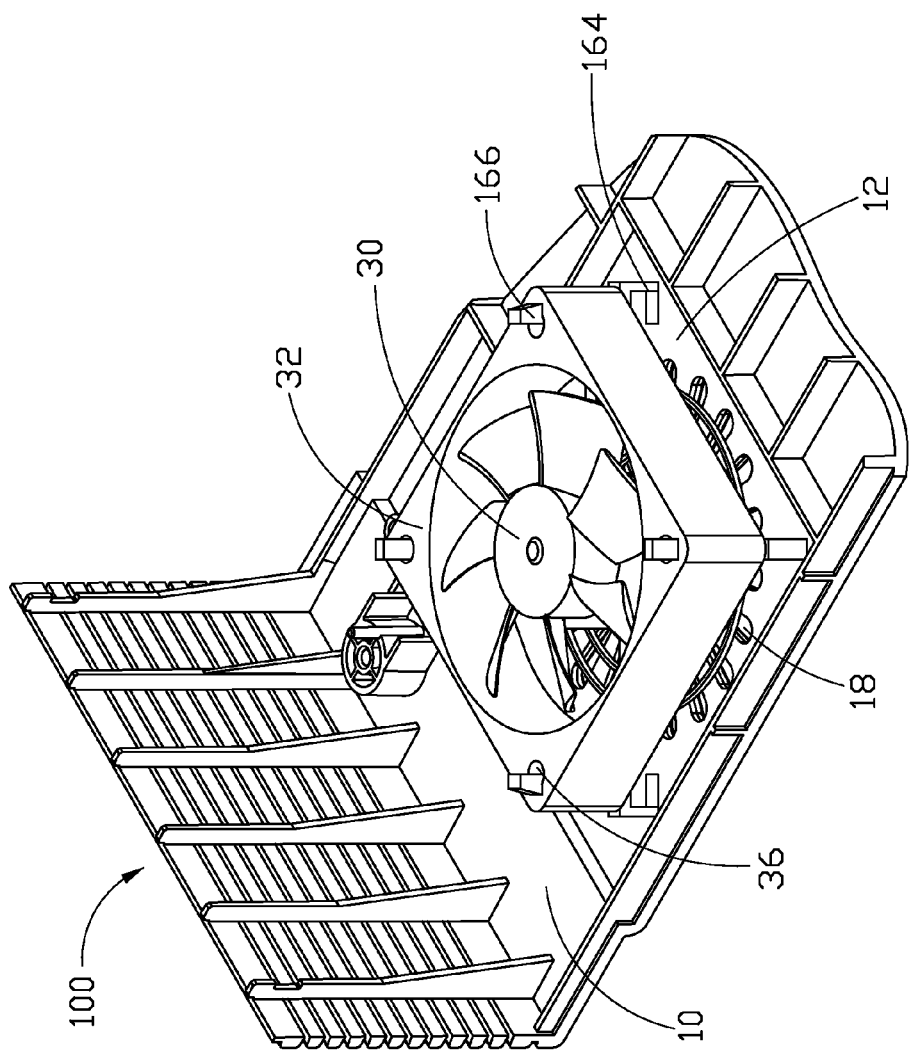
FIG. 2 is an assembled view of FIG. 1.

Referring to FIG. 1 and FIG. 2, an electronic device 100 of an exemplary embodiment of the present disclosure is illustrated. The electronic device 100 includes an enclosure 10 and a fan 30. The electronic device 100 may be a computer, or an Internet appliance, but the disclosure is not limited thereto.

The enclosure 10 accommodates electronic elements, such as, printed circuit boards (PCBs), batteries, and/or a central processing unit (CPU), for example. The enclosure 10 is substantially rectangular and it will be understood that other configurations may be utilized. The enclosure 10 includes a plurality of sidewalls 12 and a receiving space 14 surrounded by the plurality of sidewalls 12 to receive the electronic elements.

The enclosure 10 further includes a plurality of fixing members 16 and a plurality of holes 18. Each of the plurality of fixing members 16 project from an inner surface of one of the plurality of sidewalls 12 and are positioned around the plurality of holes 18. An area surrounded by the plurality of holes 18 is substantially equal to an area of a projection of the fan on the sidewall 12. In the illustrated embodiment, there are four fixing members 16. The plurality of holes 18 are arranged in a substantially circular fashion and it will be understood that other configurations may be utilized.

The plurality of fixing members 16 are integrally formed with the enclosure 10. In the illustrated embodiment, the plurality of fixing members 16 may be formed using an injection mold process to conserve part costs. However, it may be understood by those of ordinary skill in the art that the plurality of fixing members 16 may be formed using other techniques.

Each of the plurality of fixing members 16 includes a clasping portion 162 including a hook 166 located at a distal end thereof, and an L-shaped cushioning portion 164 between the clasping portion 162 and the sidewall 12. In other embodiments, the cushioning portion 164 may form other angled shapes besides an L-shape, such as a C-shape.

The fan 30 is mounted in the enclosure 10 to dissipate the heat generated by the electronic elements, and includes a frame 32 to fix the fan 30 in the enclosure 10. The frame 32 is substantially square and it will be understood that other configurations may be utilized. The frame 32 includes a vent 34 located in a bottom thereof and corresponding to the plurality of holes 18, and a plurality of mounting holes 36 corresponding to the plurality of fixing members 16. The plurality of mounting holes 36 are respectively positioned in a pair of diagonal corners of the frame 32.

In assembly, the plurality of hooks 166 of the plurality of clasping portions 162 extend through the corresponding mounting hole 36 of the frame 32 to clasp the frame 32, thus the fan 30 is fixed in the enclosure 10 by the plurality of fixing members 16. In the assembled state, the plurality of cushioning portions 164 is positioned between the fan 30 and the sidewall 12. In other words, there is a resilient cushion between the fan 30 and the sidewall 12.

The fan 30 is fixed in the enclosure 10 of the electronic device 100 by the plurality of fixing members 16 rather than screws, resulting in convenience of assembly or disassembly of the fan 30.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:

1. An electronic device comprising
a fan comprising a frame comprising a plurality of mounting holes respectively positioned in a plurality of diagonal corners of the frame; and
an enclosure comprising a plurality of sidewalls and a plurality of fixing members to fix the fan in the enclosure, each of the plurality of fixing members comprising a clasping portion and a angled shape cushioning portion between the clasping portion and a sidewall of the plurality of sidewalls the sidewall, wherein each of the plurality of fixing members projects from an inner surface of the sidewall and is integrally formed with the sidewall;
wherein the plurality of cushioning portions are corresponding to the plurality of mounting holes; respectively, and positioned between the fan and the sidewall.

2. The electronic device as recited in claim 1, wherein each of the plurality of cushioning portions is substantially L-shaped or C-shaped.

3. The electronic device as recited in claim 1, wherein the frame defines a vent positioned in a bottom thereof, and the sidewall defines a plurality of holes corresponding to the vent.

4. The electronic device as recited in claim 3, wherein an area surrounded by the plurality of holes is substantially equal to an area of a projection of the fan on the sidewall.

5. The electronic device as recited in claim 1, wherein each of the clasping portions comprises a hook positioned at a distal end thereof.

* * * * *